(12) United States Patent
Kosuga

(10) Patent No.: US 6,946,862 B2
(45) Date of Patent: Sep. 20, 2005

(54) ELECTRONIC APPARATUS, SPECIFICATION IDENTIFICATION METHOD THEREFOR AND MANUFACTURING METHOD THEREFOR

(75) Inventor: Tadashi Kosuga, Kawagoe (JP)

(73) Assignee: Pioneer Corporation, Tokyo (JP)

( * ) Notice: Subject to any disclaimer, the term of this patent is extended or adjusted under 35 U.S.C. 154(b) by 83 days.

(21) Appl. No.: 10/677,343

(22) Filed: Oct. 3, 2003

(65) Prior Publication Data
US 2004/0085056 A1 May 6, 2004

(30) Foreign Application Priority Data
Oct. 8, 2002 (JP) ........................................ 2002-295231

(51) Int. Cl.[7] ............................................. G01R 31/02
(52) U.S. Cl. ...................................................... 324/763
(58) Field of Search ................................ 324/763, 765, 324/767

(56) References Cited

U.S. PATENT DOCUMENTS

| | | | | |
|---|---|---|---|---|
| 5,497,094 A | * | 3/1996 | George | 324/529 |
| 6,087,841 A | * | 7/2000 | Bonaccio et al. | 324/757 |
| 6,161,213 A | * | 12/2000 | Lofstrom | 324/764 |
| 6,229,328 B1 | * | 5/2001 | Lueders | 324/765 |
| 6,294,921 B1 | * | 9/2001 | Bonaccio et al. | 324/756 |
| 6,819,132 B2 | * | 11/2004 | Byrd | 324/765 |

FOREIGN PATENT DOCUMENTS

| | | |
|---|---|---|
| EP | 1 104 102 A1 | 5/2001 |
| GB | 2 251 105 A | 6/1992 |

* cited by examiner

Primary Examiner—Jermele Hollington
(74) Attorney, Agent, or Firm—Sughrue Mion, PLLC

(57) ABSTRACT

An electronic apparatus includes a specific circuit component having a circuit constant included in a function circuit serving a specific circuit function, and a measurement terminal for measuring the circuit constant. The circuit constant has a value in accordance with a specification. The electronic apparatus can avoid a misidentification during an identification procedure of the specification.

19 Claims, 8 Drawing Sheets

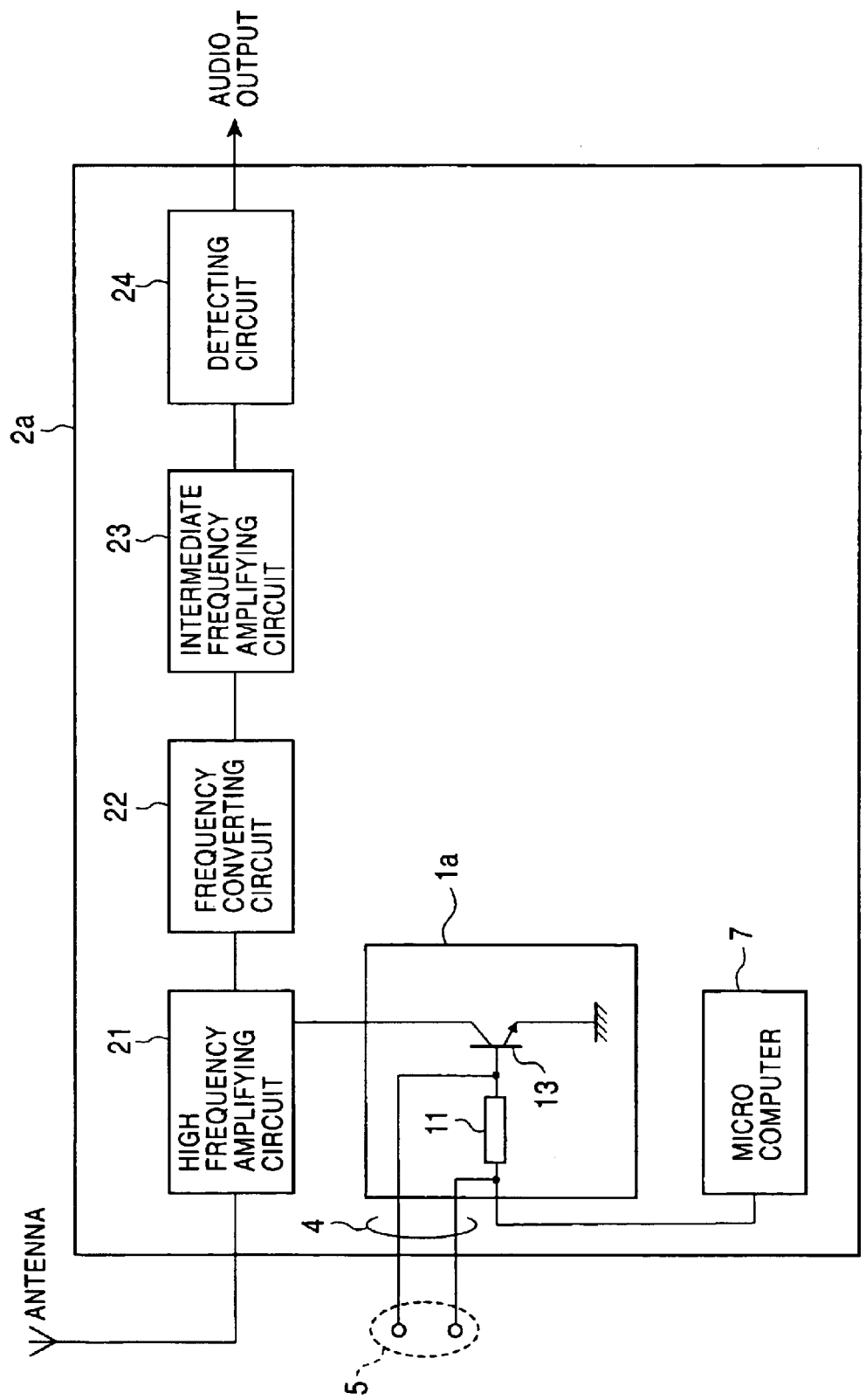

FIG. 4

TABLE OF RELATIONSHIP BETWEEN CIRCUIT
CONSTANT AND SPECIFICATION INFORMATION

| CIRCUIT CONSTANT VALUE (RESISTANCE VALUE) | SPECIFICATION INFORMATION (DESTINATION) |
|---|---|
| 1KΩ | JAPAN |
| 2KΩ | NORTH AMERICA |
| 3KΩ | SOUTH AMERICA |
| 4KΩ | EUROPE |
| 5KΩ | MIDDLE EAST |
| 6KΩ | AUSTRALIA |
| 7KΩ | SOUTHEAST ASIA |

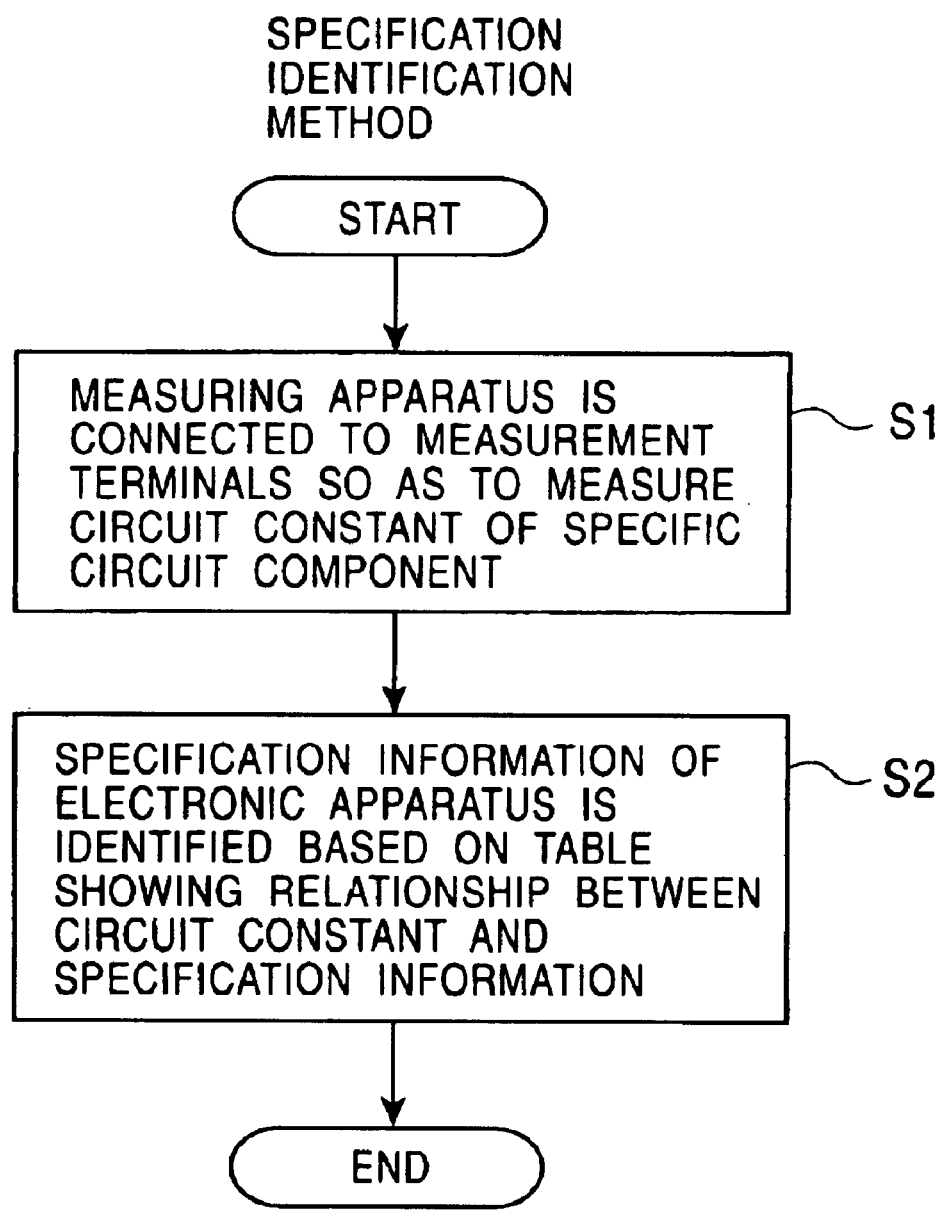

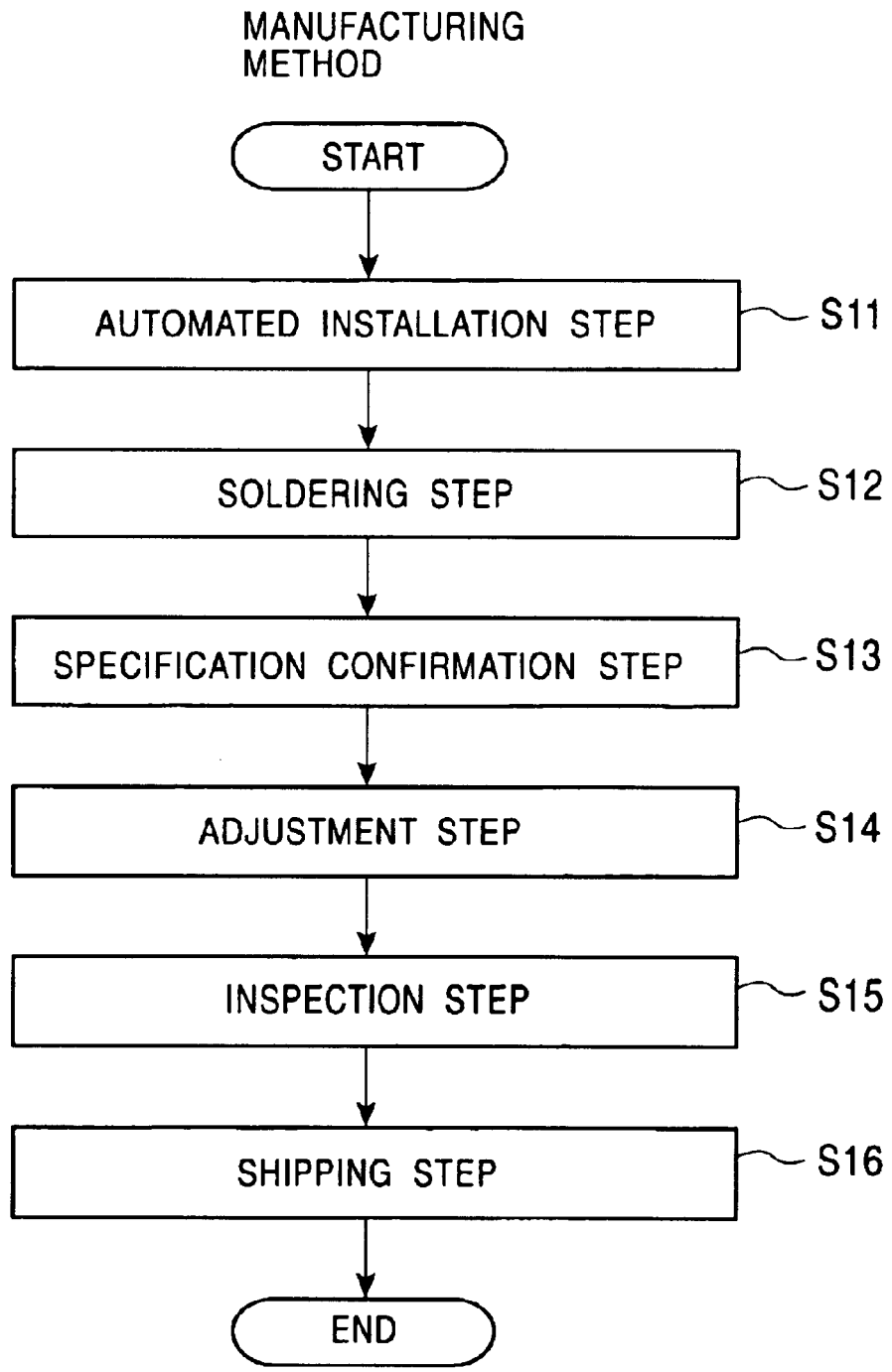

US 6,946,862 B2

ELECTRONIC APPARATUS, SPECIFICATION IDENTIFICATION METHOD THEREFOR AND MANUFACTURING METHOD THEREFOR

BACKGROUND OF THE INVENTION

1) Field of the Invention

The present invention relates to an electronic apparatus, a specification identification method therefor and a manufacturing method therefor.

2) Description of the Related Art

When a plurality of electronic apparatuses are the same model or type, their fundamental specifications are generally the same with respect to each other. However, even though a plurality of electronic apparatuses are the same model, sometimes there is a need to differentiate particular specification of the electronic apparatus, in order to comply with a destination, i.e., a country to which an apparatus is exported.

For example, each FM tuner unit receiving an FM broadcast signal has an individual broadcasting frequency band which corresponds to its destination where the tuner is used. Specifically, a broadcasting frequency band for Japan is 76.1 MHz–89.9 MHz, it is 87.9 MHz–107.9 MHz for North America, and it is 87.5 MHz–108 MHz for Europe. Therefore, before shipment of the tuner unit, a frequency band used in the tuner unit is adjusted in accordance with the destination, and a microcomputer provided within or outside the tuner unit for controlling the tuner unit is adjusted accordingly.

It is difficult to identify the difference of the specification of the electronic apparatus such as the tuner unit by merely observing the exterior of the apparatus. Therefore, such difference in the specification is usually identified by a printed matter or printing such as a seal made on or attached on a housing of the electronic apparatus. Such approach however requires a visual check, which is likely to cause a manufacturing error resulting from misidentification.

SUMMARY OF THE INVENTION

The above-described problem is one problem to be solved by the present invention.

According to a first aspect of the present invention, there is provided an electronic apparatus comprising a specific circuit component having a circuit constant included in a function circuit providing a specific circuit function, and a measurement terminal for measuring the circuit constant, wherein the circuit constant has a value in accordance with a specification.

According to second aspect of the present invention, there is provided a specification identification method for an electronic apparatus including a specific circuit component having a circuit constant included in a function circuit having a specific circuit function, and a measurement terminal for measuring the circuit constant. The method comprising measuring the circuit constant by connecting the measurement terminal with a measuring apparatus, and identifying a specification in accordance with a value of the measured circuit constant.

According to third aspect of the present invention, there is provided a manufacturing method for an electronic apparatus including a specific circuit component having a circuit constant included in a function circuit having a specific circuit function, and a measurement terminal for measuring the circuit constant. The method comprising providing the specific circuit component and the measurement terminals, measuring the circuit constant by connecting the measurement terminal with a measuring apparatus, and identifying a specification in accordance with a value of the measured circuit constant.

BRIEF DESCRIPTION OF THE DRAWINGS

FIG. 2 is a block diagram showing a circuitry of the electronic apparatus shown in FIG. 1;

FIG. 4 is a table showing one example of relationship between a circuit constant and specification information;

FIG. 9 is a flowchart showing an embodiment of a specification identification method the present invention; and FIG. 10 is a flowchart showing an embodiment of a manufacturing method of the present invention.

DETAILED DESCRIPTION OF THE INVENTION

Embodiments of the present invention will be described in detail with reference to the attached drawings.

Figure 1:
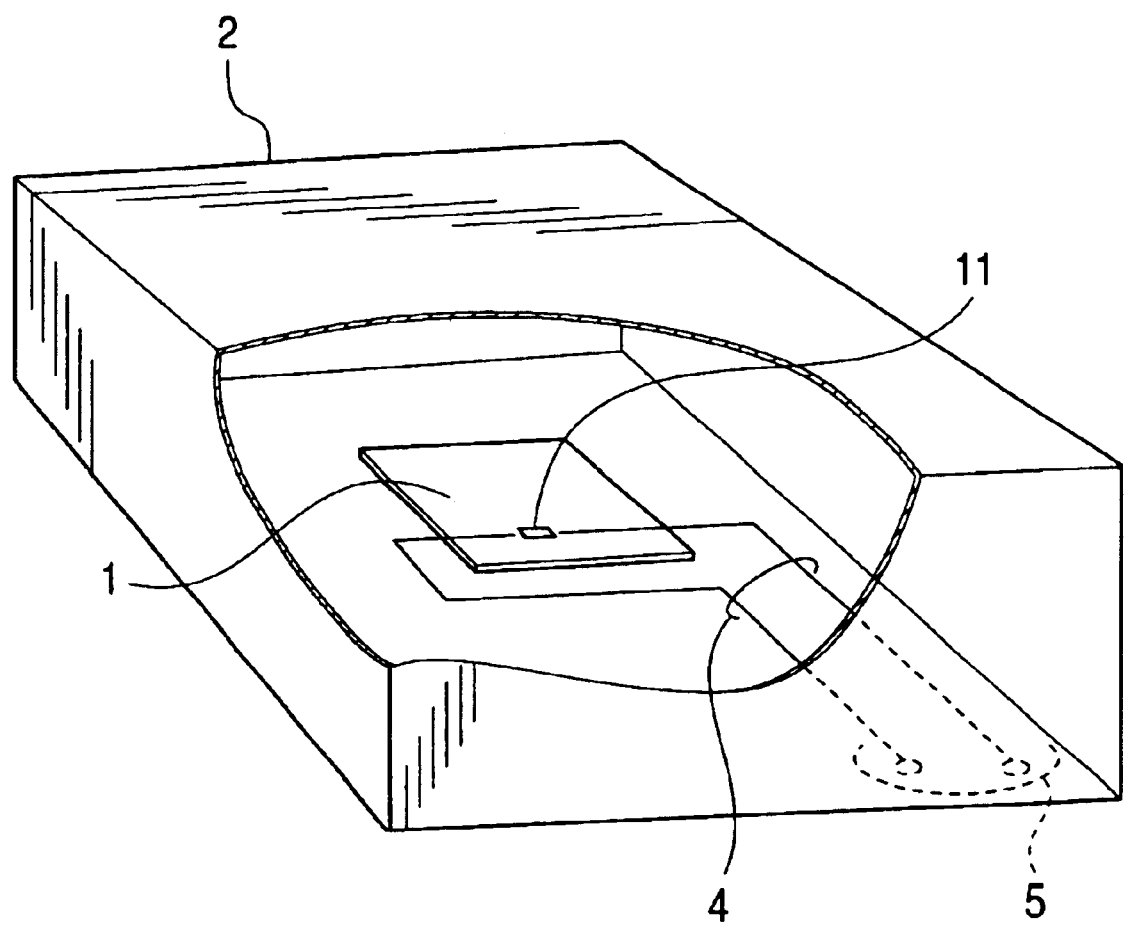
FIG. 1 is a perspective view of an electronic apparatus according to one embodiment of the present invention.

FIG. 1 illustrates an embodiment of the present invention showing an appearance and an internal structure of an electronic apparatus 2. An FM tuner unit is shown as an example of the electronic apparatus 2. Since the electronic apparatus 2 is an FM tuner unit, the apparatus has a function of receiving an FM broadcast signal, amplifying the signal, detecting the signal, and then outputting the signal as an audio signal. The FM tuner unit includes a common circuit 1 which is a functional circuit having a specific circuit function. The term "specific circuit function" means a function performed by the common circuit 1. The common circuit 1 includes a resistor element 11 which is a specific circuit component indicating specification information. The resistor element 11 is a device having two terminals, and has a constant resistance value Rb as a circuit constant. A pair of leader lines 4 are connected to the two terminals of the resistor element 11. The leader lines 4 are also connected to a pair of measurement terminals 5. The leader lines 4 and the measurement terminals 5 form a current channel for measurement of the resistance value Rb of the resistor element 11. The measurement terminals 5 are preferably provided on the outer surface of the FM tuner unit so that a measuring apparatus can be easily electrically contacted to the terminals.

FIG. 2 shows circuitry of an FM tuner unit 2a. The FM tuner unit 2a is one example of the electronic apparatus 2 shown in FIG. 1. The FM tuner unit 2a includes a high frequency amplifying circuit 21, a frequency converting circuit 22, an intermediate frequency amplifying circuit 23, a detecting circuit 24, and a microcomputer 7. The FM tuner unit 2a amplifies a broadcast signal received by an antenna at the high frequency amplifying circuit 21, and then converts the signal to a signal having an intermediate frequency by the frequency converting circuit 22. The signal having the intermediate frequency is further amplified by the intermediate frequency amplifying circuit 23, the signal is converted to an audio signal at the detecting circuit 24, and then the signal is output as an audio output. The FM tuner unit 2a also includes a sensitivity switching circuit 1a which changes an amplification factor of the high frequency amplifying circuit 21 so as to switch an auto-tuning sensitivity. The sensitivity switching circuit 1a is one example of the common circuit 1 shown in FIG. 1. The sensitivity switching circuit 1a is connected to the high frequency amplifying circuit 21, and serves as a switching circuit to change a bias voltage of a transistor included in the high frequency amplifying circuit 21. Specifically, the sensitivity switching circuit 1a switches the auto-tuning sensitivity by changing the amplification factor of the high frequency amplifying circuit 21 in accordance with a control signal from the microcomputer 7. The specific circuit function in this embodiment is a function for changing the amplification factor of the high frequency amplifying circuit 21, or a switching function for changing the bias voltage of the transistor. The sensitivity switching circuit 1a includes a resistor element 11 and a transistor 13 which are parts of the circuit 1a for performing the switching function. The resistor element 11 is a specific circuit element having two terminals, and has a resistance value Rb as a circuit constant. The two terminals of the resistor element 11 are connected to a pair of the measurement terminals 5 via a pair of leader lines 4. The leader lines 4 and the measurement terminals 5 form the current channel for measurement of the resistance value of the resistor element 11. One terminal of the resistor element 11 of the sensitivity switching circuit 1a that is opposite from the terminal connected to the transistor 13 is connected to the microcomputer 7. The microcomputer 7 has a function of controlling an operation of the FM tuner unit 2a. The microcomputer 7 controls the FM tuner unit 2a differently depending on the individual specification of the unit such as the destination of the FM tuner unit 2a. Although the microcomputer 7 is provided within the FM tuner unit 2a in the present embodiment, the microcomputer may be provided outside the FM tuner unit 2a.

Figure 3A:
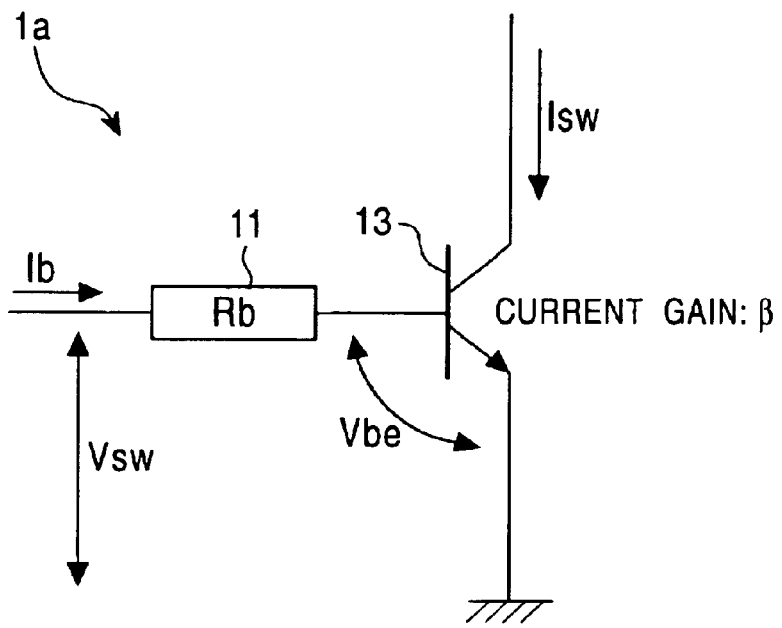
FIG. 3A is a diagram showing an operation and a condition of a common circuit shown in FIG. 1.
Figure 3B:
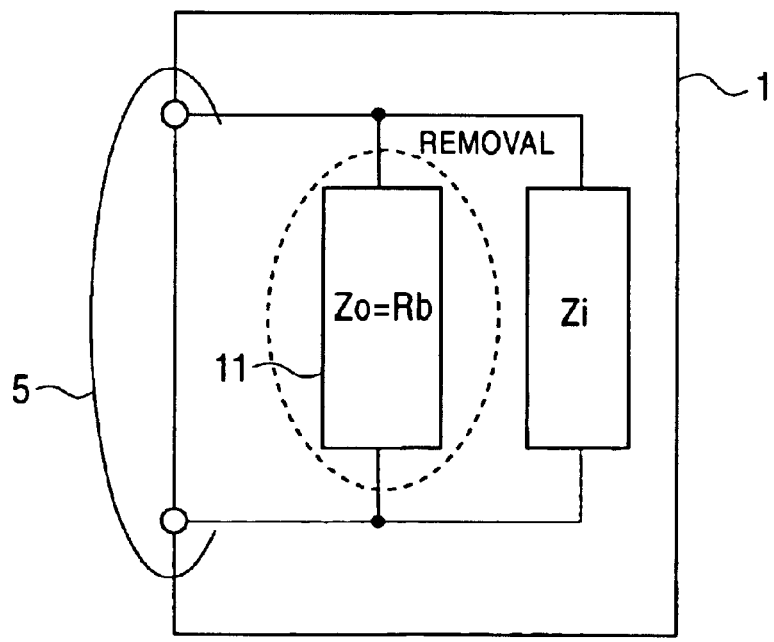
FIG. 3B is a diagram showing a necessary condition for an impedance of the common circuit shown in FIG. 1.

FIGS. 3A and 3B illustrate an operation and a condition of the common circuit shown in FIG. 1.

Referring to FIG. 3A, the operation of the sensitivity switching circuit 1a is shown which is an example of the common circuit 1. According to the diagram, the resistance value Rb of the resistor element 11 can be expressed by the following equations:

$$Ib = (Vsw - Vbe)/Rb$$

$$Isw = Ib \cdot \beta$$

therefore, $$Rb = (Vsw - Vbe) \cdot \beta / Isw$$

where Vsw denotes a voltage to control the transistor 13 forming the switching circuit, Isw denotes a switching current or a collector current, Ib denotes a base current of the transistor 13, β denotes a current gain of the transistor 13, and Vbe denotes a voltage between the base and the emitter of the transistor 13.

The base current obtained from the above equation is a minimum required current to be supplied via the resistor element 11 having the resistance value Rb. A maximum value of the base current is determined by an allowable base current of the transistor 13 to be utilized. The allowable base current value can be several hundreds of times to several thousands of times larger than the calculated value obtained from the above equation. Because the resistance value Rb is inversely proportional to the current, on condition that the applied voltage is constant, the resistance value Rb of the resistor element 11 can be arbitrarily set within the range between the maximum value obtained from the equation, and the minimum value. The minimum value may be between 1/200 and 1/6000 of the maximum value. Therefore, the resistance value Rb of the resistor element 11 can have an arbitrary value within the range, on the condition that a switching function can be achieved within the range. Accordingly, such value can represent specification information of the electronic apparatus. The specification information may include various information to specify the electronic apparatus such as identification information of a destination, i.e., a country where the apparatus is exported, and identification information of a frequency band used in a wireless application, i.e., an FM tuner.

Referring to FIG. 3B, a necessary condition for an impedance of the common circuit 1 is shown. According to the diagram of FIG. 3B, an internal impedance Zi, i.e., an impedance Zi measured via the measurement terminals 5 while the specific circuit component 11 is removed from the circuit, must be sufficiently higher, for example, several tens of times higher, than an impedance Zo. The impedance Zo is equal to Rb, and is determined by the circuit constant of the specific circuit component 11. When the above condition is not satisfied, an error is generated in the circuit constant of the component, thereby making it impossible to provide the accurate specification information. For example, assuming that the specific circuit component is a resistor element, the resistor element generally has a manufacturing error of approximately 5% which deviates from the resistance value of the nominal standard. Therefore, when the internal impedance Zi is approximately twenty times (1/0.05) or more than the resistance value of the resistor element, the resistance value can be measured within the accuracy of the manufacturing tolerance.

FIG. 4 is a table showing the relationship between the circuit constant and the specification information. According to the table, a series of resistance values with 1 KΩ increment from 1 KΩ through 7 KΩ respectively correspond to various destinations, i.e., Japan, North America, South America, Europe, Middle East, Australia, and Southeast Asia. Accordingly, the destination of the electronic apparatus 2 which has the resistor element 11 can be identified by measuring the resistor element 11 (see FIGS. 1–3).

The table is generally used to confirm the specification of the electronic apparatus based on the circuit constant, which is measured during the manufacturing process under the supervision of a manufacturer of the electronic apparatuses. The table may be stored in a memory of the measuring apparatus which measures the circuit constant, so that the specification information such as the identification information showing the destination can be readily displayed on the measuring apparatus in response to the measurement of the circuit constant, thereby providing a simple identification of the specification.

Figure 5:
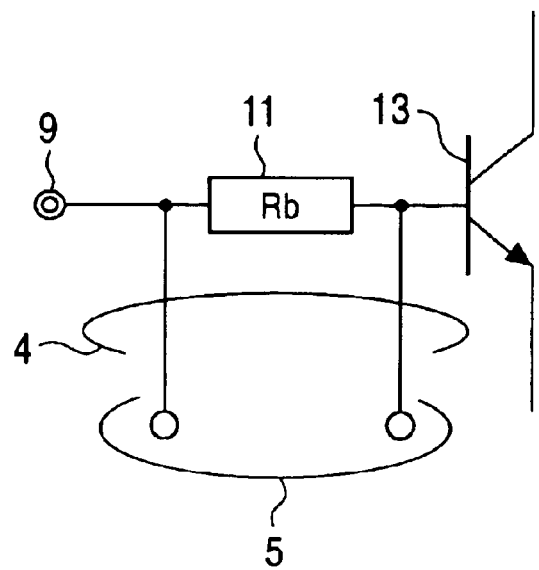
FIG. 5 is a circuit diagram according to an example of the present invention.

FIG. 5 shows an example of the common circuit according to the present invention. The common circuit has a switching function on the collector current of the transistor 13 by means of the base current of the transistor 13 that is input via the resistor element 11. Each terminal of the resistor element 11 as the specific circuit component is connected to each of the measurement terminal pair 5 via each leader line 4. Furthermore, one terminal of the resistor element 11 is connected to an external terminal 9 which is an externally provided open terminal, and the other terminal is connected to the base of the transistor 13. The external terminal 9, which supplies the base current from an external source to the transistor 13, remains open during a product inspection. Therefore, a measurement current flows only to the resistor element 11 during the measurement of a resistance value R of the resistor element 11, which allows accurate measurement of the resistance value R, i.e., the circuit constant. Accordingly, the resistance value R having accurate relationship with the specification information can be obtained. The resistor element 11 has a function of supplying the base current which is input from the external source to the transistor 13.

Figure 6:
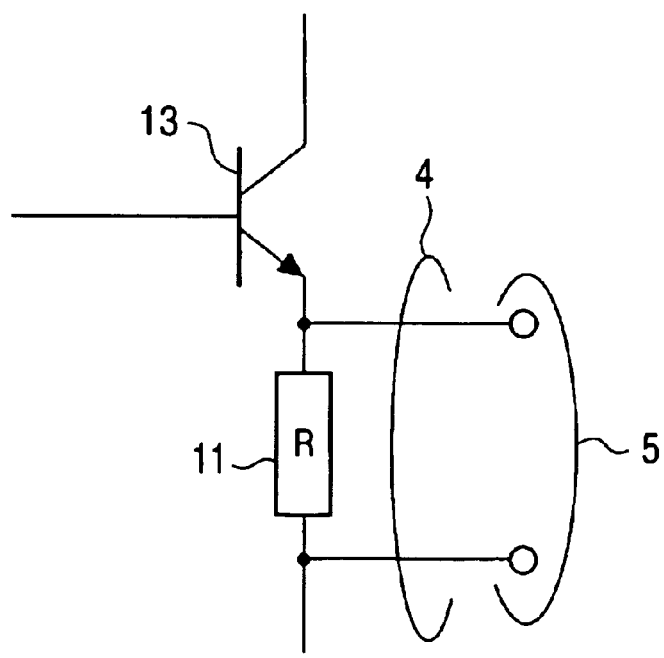
FIG. 6 is a circuit diagram according to another example of the present invention.

FIG. 6 shows another example of the common circuit according to the present invention. The common circuit outputs a change of the collector current of the transistor 13 as a voltage change generated across the terminals of the resistor element 11, which is amplified in response to the base current applied to the transistor 13. Both terminals of the resistor element 11 are connected to the measurement terminals 5 via leader lines 4. One terminal of the resistor element 11 is connected to the emitter of the transistor 13. The resistor element 11 has a function of transforming the change of the collector current of the transistor 13 into a change of the voltage, and has a function of outputting such change of the voltage.

In this example, when the measuring apparatus (not shown) for measuring the resistance value of the resistor element 11 is connected to the measurement terminals 5, a voltage is applied from the measuring apparatus, which may cause adverse effects on other components including the transistor 13. Damage to the transistor 13 can be prevented by applying a measuring voltage in such a manner that the emitter side has a positive potential and the base side has a negative potential, and that the measuring voltage is kept below an allowable voltage applied in the direction from the emitter to the base of the transistor 13, such as 5 volt.

Figure 7:
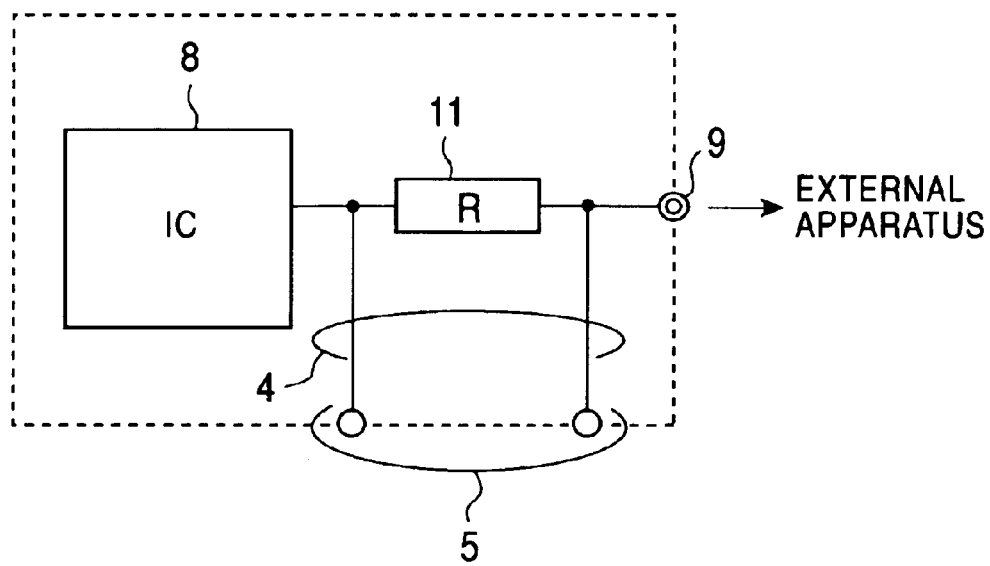
FIG. 7 is a circuit diagram according to yet another example of the present invention.

FIG. 7 shows yet another example of the common circuit according to the present invention. The common circuit has a function of outputting a signal to an external apparatus via the resistor element 11 and the external terminal 9. Such signal is processed by an IC 8. One terminal of the resistor element 11 is connected to the IC 8 provided for signal processing, and the other terminal is connected to the external apparatus via an external terminal 9 which is an externally provided open terminal. Both ends of the resistor element 11 are connected to measurement terminals 5 via leader lines 4. Accordingly, during the measurement of the circuit constant of the resistor element 11, the external terminal 9 remains open without contacting any external apparatus, such that the circuit constant of the resistor element 11 can be accurately measured. When the IC terminal is directly connected to the external apparatus, the resistor element 11 performs a function of the resistor which filters out a noise included in a signal processed in the IC, or prevents electrostatic damage of the IC.

Figure 8:
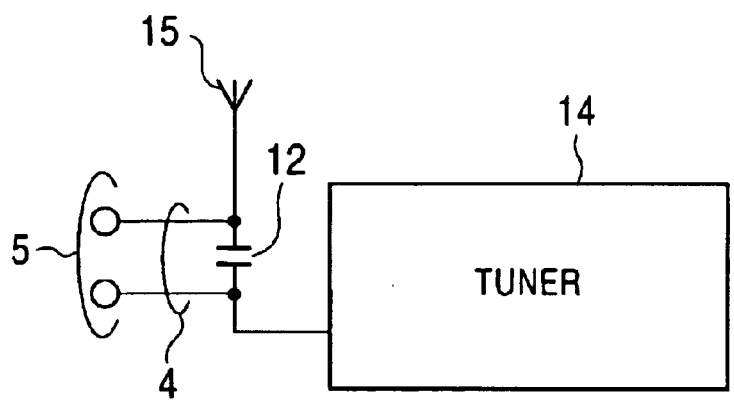
FIG. 8 is a circuit diagram according to yet another example of the present invention.

FIG. 8 shows yet another example of the common circuit according to the present invention. The common circuit receives a signal via the antenna 15 and applies the signal to the tuner 14 via a capacitor 12. The signal is tuned, detected and amplified in the tuner 14. Both terminals of the capacitor 12 as the specific circuit component are connected to measurement terminals 5 via leader lines 4. One terminal of the capacitor 12 is connected to the antenna 15, and the other terminal is connected to the tuner 14. In the case of measuring the circuit constant of the capacitor 12, it is necessary to employ a measuring frequency having sufficiently low frequency to measure a capacity of the capacitor 12, such that a reactance of the antenna 15 connected to one terminal of the capacitor 12 can be neglected. The capacitor 12 as the specific circuit component is a capacitor for cutting a DC voltage. Specifically, the capacitor 12 has a function of preventing damage to the tuner 14 due to the voltage application from the antenna 15.

FIG. 9 shows an embodiment of a specification identification method according to the present invention. Firstly, the measuring apparatus is connected to the measurement terminals in order to measure the circuit constant of the specific circuit component (step S1). The measuring apparatus may be a conventional tester or a measuring device using a bridge balanced circuit. Secondly, the specification information of the electronic apparatus is identified based on the measured circuit constant by using the table of the relationship between the circuit constant and the specification information (step S2). This step of identifying the specification information includes two steps, i.e., a comparison step in which the circuit constant is compared with a constant determined in advance based on the individual specification, and a determination step in which the specification indicated by the measured circuit constant is determined by using the comparison result of the comparison step.

The step of identifying the specification information may be performed, for example, by storing the table showing the relationship between the circuit constant and the specification information (see FIG. 4) in a memory of the measuring apparatus which measures the circuit constant, and promptly displaying the specification information, such as the destination of the measuring apparatus, upon measurement of the circuit constant.

The specification identification method may further include an adjustment and inspection step which performs adjustment and/or inspection of the electronic apparatus in accordance with the identified specification, after performing the step of identifying the specification information.

FIG. 10 shows an embodiment of a manufacturing method according to the present invention.

A manufacturing process of an electronic apparatus such as a tuner unit generally includes a series of steps including an automated installation step in which electronic components are automatically installed on a printed-circuit board by an automated installation machine, a soldering step in which the installed electronic components are soldered to the printed-circuit board by an automated soldering machine, an adjustment step in which the apparatus is adjusted such as an adjustment of a frequency band used in the apparatus in accordance with the specification of the tuner, an inspection step in which performance of the apparatus is inspected such as an inspection of tracking performance at the adjusted frequency band, and a shipping step in which the electronic apparatuses are prepared for shipment to a destination. In general, numerical constants determined during the adjustment step or the inspection step are checked, for confirmation whether the electronic apparatuses are manufactured in accordance with the specification.

The manufacturing method according the present invention includes a specification confirmation step in which the specification of the electronic apparatus is confirmed by using the specification identification method. The specification confirmation step is performed before the adjustment step and the inspection step. Thus, the manufacturing method includes an automated installation step (step S11), a soldering step (step S12), a specification confirmation step (step S13), an adjustment step (step S14), an inspection step (step S15) and a shipping step (step S16). In the specification confirmation step (step S13), the same method as the specification identification method is performed. Specifically, the specification of the electronic apparatus is confirmed by the comparison step in which the measuring apparatus is connected to the measurement terminal of the electronic apparatus being manufactured, the circuit constant of the specific circuit component is measured, and the circuit constant is compared with the constant that is determined in advance based on the individual specification, and the determination step in which the specification designated by the measured circuit constant is determined by using the comparison result of the comparison step. Based on the specification, the adjustment step and the inspection step are performed after the specification confirmation step. For example, when the specification information designates the identification information of the frequency band used in the electronic apparatus, the frequency of the electronic apparatus is adjusted and inspected in accordance with the confirmed frequency band. It should be noted that the manufacturing method according the present invention may not include the automated installation step (step S11), a soldering step (step S12), and a shipping step (step S16).

As described above, the functional circuit of the electronic apparatus, i.e., the circuit constant of the specific circuit component included within the common circuit, is configured to have two functions of identifying the specification and performing the specific circuit function of the common circuit.

When the specifications of a plurality of electronic apparatuses according to the present invention differ with each other even though the apparatuses are of the same model, each specific circuit component included in the common circuit will be adjusted to have an individual circuit constant based on the individual specification. In this instance, the common circuits included in the electronic apparatuses have the same configuration with respect to each other. A plurality of electronic apparatuses belonging to the same model means that the appearances, the internal structures and the functions of the electronic apparatuses are the same with respect to each other, so that the plurality of electronic apparatus are compatible with each other, when the difference of the specifications such as the frequency bands used in the apparatuses is not considered. Therefore, when the models of the electronic apparatuses are the same with respect to each other, the common circuits have the same configuration. When the models and the specifications are both the same with respect to each other, the common circuits including the circuit constants of the specific circuit components have the same configuration. On the other hand, when the models are the same but the specifications are different, the common circuits, except for the circuit constants of the specific circuit components, have the same configuration, and the circuit constants differ depending on the specification.

As easily understood in the embodiments of the tuner unit according to the present invention, the difference of the product specification can be easily identified by an electrical check at a test point provided on the electronic apparatus, i.e., the measurement terminal. The identification is achieved by differentiating the circuit constant which is adjustable within a predetermined range in accordance with the specification such as the destination. The circuits are provided in all electronic apparatuses belonging to the same model.

It should be noted that the embodiment and examples have been described based on the resistor element as the specific circuit component which is adjusted to have a different resistant value depending on the difference of the specification such as the destination, but the specific circuit component is not limited to the resistor. The specific circuit component may be any electronic components having two terminals such as a capacitor and a coil, which have a measurable circuit constant such as a capacity value and an inductance value, respectively. Furthermore, the electronic apparatus may include a plurality of electronic components having different values corresponding to different specification information. By combining the circuit constants among a plurality of circuit components, various information can be expressed. In this instance, a plurality of measurement terminals and a plurality of current channels are necessary depending on the number of circuit components. The electronic apparatus according to the present invention is not limited to the tuner unit, and can be applied to various electronic apparatuses.

This application is based on a Japanese patent application No. 2002-295231 which is herein incorporated by reference.

What is claimed is:

1. An electronic apparatus comprising:
    a specific circuit component having a circuit constant included in a function circuit providing a specific circuit function; and
    a measurement terminal for measuring the circuit constant;
    wherein the circuit constant has a value in accordance with a specification, and
    wherein the specific circuit component forms a part of a circuit which switches an auto-tuning sensitivity within the function circuit.

2. The electronic apparatus according to claim 1, wherein the circuit constant of the specific circuit component has a value suitable for identifying the specification and performing the specific circuit function by the function circuit.

3. The electronic apparatus according to claim 1, wherein an internal impedance measured via the measurement terminal while the specific circuit component is removed is higher than an impedance of the specific circuit component.

4. The electronic apparatus according to claim 1, wherein the circuit which switches the auto-tuning sensitivity is a switching circuit which switches the auto-tuning sensitivity by changing an amplification factor of a high frequency amplifier in response to a control signal from a microcomputer.

5. An electronic apparatus comprising:
    a specific circuit component having a circuit constant included in a function circuit providing a specific circuit function; and
    a measurement terminal for measuring the circuit constant;
    wherein the circuit constant has a value in accordance with a specification, and
    wherein the specification comprises identification information of a frequency band used in the electronic apparatus.

6. The electronic apparatus according to claim 5, wherein the specific circuit component is a resistor having two terminals, a capacitor having two terminals, or a coil having two terminals.

7. The electronic apparatus according to claim 5, wherein the specification comprises identification information of a destination of the electronic apparatus.

8. The electronic apparatus according to claim 5, wherein the circuit constant of the specific circuit component has a value suitable for identifying the specification and performing the specific circuit function by the function circuit.

9. The electronic apparatus according to claim 5, wherein an internal impedance measured via the measurement terminal while the specific circuit component is removed is higher than an impedance of the specific circuit component.

10. An electronic apparatus comprising:
  a specific circuit component having a circuit constant included in a function circuit providing a specific circuit function: and
  a measurement terminal for measuring the circuit constant;
  wherein the circuit constant has a value in accordance with a specification,
  wherein the specific circuit component is a resistor having two terminals, a capacitor having two terminals, or a coil having two terminals,
  wherein one terminal of the specific circuit component is connected to an external terminal, and
  wherein another terminal of the specific circuit component is connected to an internal IC for filtering noise or preventing electrostatic damage.

11. An electronic apparatus comprising:
  a specific circuit component having a circuit constant included in a function circuit providing a specific circuit function; and
  a measurement terminal for measuring the circuit constant;
  wherein the circuit constant has a value in accordance with a specification,
  wherein the specific circuit component is a resistor having two terminals, a capacitor having two terminals, or a coil having two terminals, and
  wherein the specific circuit component is connected between the external antenna and the tuner for prevention of damage to the tuner.

12. A specification identification method for an electronic apparatus including a specific circuit component having a circuit constant included in a function circuit having a specific circuit function, and a measurement terminal for measuring the circuit constant, the method comprising:
  measuring the circuit constant by connecting the measurement terminal with a measuring apparatus;
  and identifying a specification in accordance with a value of the measured circuit constant,
  wherein the specification comprises identification information of a frequency band used in the electronic apparatus.

13. The specification identification method according to claim 12, wherein the identification step includes comparing the circuit constant with a constant that is predetermined based on the individual specification, and determining the specification by using the comparison result.

14. The electronic apparatus according to claim 12, wherein the specification comprises identification information of a destination of the electronic apparatus.

15. A manufacturing method for an electronic apparatus including a specific circuit component having a circuit constant included in a function circuit having a specific circuit function, and a measurement terminal for measuring the circuit constant, the method comprising:
  providing the specific circuit component and the measurement terminal;
  measuring the circuit constant by connecting the measurement terminal with a measuring apparatus; and
  identifying a specification in accordance with a value of the measured circuit constant,
  wherein the specification comprises identification information of a frequency band used in the electronic apparatus.

16. The manufacturing method according to claim 15 further including adjusting and/or inspecting the electronic apparatus in accordance with the identified specification.

17. The electronic apparatus according to claim 15, wherein the specification comprises identification information of a destination of the electronic apparatus.

18. A specification identification method for an electronic apparatus including a specific circuit component having a circuit constant included in a function circuit having a specific circuit function, and a measurement terminal for measuring the circuit constant, the method comprising:
  measuring the circuit constant by connecting the measurement terminal with a measuring apparatus;
  and identifying a specification in accordance with a value of the measured circuit constant,
  wherein the specification comprises identification information of a destination of the electronic apparatus.

19. A manufacturing method for an electronic apparatus including a specific circuit component having a circuit constant included in a function circuit having a specific circuit function, and a measurement terminal for measuring the circuit constant, the method comprising:
  providing the specific circuit component and the measurement terminal;
  measuring the circuit constant by connecting the measurement terminal with a measuring apparatus; and
  identifying a specification in accordance with a value of the measured circuit constant,
  wherein the specification comprises identification information of a destination of the electronic apparatus.

* * * * *